United States Patent [19]

Popovic et al.

[11] Patent Number: 4,979,149
[45] Date of Patent: Dec. 18, 1990

[54] NON-VOLATILE MEMORY DEVICE INCLUDING A MICRO-MECHANICAL STORAGE ELEMENT

[75] Inventors: Radivoje Popovic; Katalin Solt; Heinz Lienhard, all of Zug, Switzerland

[73] Assignee: LGZ Landis & Gyr Zug AG, Zug, Switzerland

[21] Appl. No.: 417,338

[22] Filed: Oct. 5, 1989

Related U.S. Application Data

[63] Continuation of Ser. No. 95,053, Sep. 9, 1987, abandoned.

[30] Foreign Application Priority Data

Sep. 10, 1986 [CH] Switzerland ............... 03647/86

[51] Int. Cl.[5] ............................................. G11C 23/00
[52] U.S. Cl. .................................. 365/244; 365/149; 365/186; 307/119
[58] Field of Search ............... 365/244, 149, 186; 350/266, 269, 484; 307/117, 119; 340/719, 783

[56] References Cited

U.S. PATENT DOCUMENTS

| | | | |
|---|---|---|---|
| 4,087,810 | 5/1978 | Hung et al. | 340/719 |
| 4,113,360 | 9/1978 | Baur et al. | 340/783 |
| 4,163,162 | 7/1979 | Micheron | 307/400 |
| 4,229,732 | 10/1980 | Hartstein et al. | 340/815.04 |
| 4,356,730 | 11/1982 | Cade | 350/484 |
| 4,441,791 | 4/1984 | Hornbeck | 357/51 |
| 4,543,457 | 9/1985 | Petersen et al. | 307/117 |
| 4,570,139 | 2/1986 | Kroll | 335/187 |
| 4,704,707 | 11/1987 | Simpson | 365/244 |
| 4,736,202 | 4/1988 | Simpson et al. | 340/783 |

OTHER PUBLICATIONS

Petersen, "Bistable Micromechanical Storage Element in Silicon", IBM Tech. Disc. Bull., vol. 20, No. 12, May 1978, p. 5309.

"Tools Make Thin Films Predictable", Electronics, May 26, 1986, pp. 16–17.

"MOS Device and Circuit Design" by Oliver J. McCarthy, John Wiley & Sons, 1983, pp. 172–177.

"A Membrane Page Composer", by L. S. Cosentino et al., R.C.A. Review, vol. 34, Mar. 1973, pp. 45–79.

"Micromechanical Membrane Switches on Silicon", by K. E. Petersen, IBM J. of R&D, Jul. 1979, pp. 376–385.

"CMOS Chips Gain EE Memory", by D. Morris et al., Electronics Week, Mar. 11, 1985, pp. 69–72.

"Silicon as a Mechanical Material" by K. E. Petersen, IEEE, vol. 70, No. 5, May 1982, pp. 420–456.

"Novel Electromechanical Etc.", by R. Vuilleumier et al., Proc. Display Res. Conf., Sep. 1984, pp. 41–44.

Primary Examiner—Glenn Gossage
Attorney, Agent, or Firm—Marmorek, Guttman & Rubenstein

[57] ABSTRACT

A memory device for digital electronic signals includes at least one micro-mechanical memory element. The memory element includes a support having recess defined therein and a curved mechanical component bridging the recess and fixed to the support. The mechanical component has two stable positions, each of which being maintained by mechanical forces, one concave down towards the support and the other convex up away from the support. The mechanical component is adapted to be selectively changed from one stable position to the other stable position during a writing cycle and to have its stable position determined during a reading cycle so that the memory element can be used for storing binary logic information.

10 Claims, 3 Drawing Sheets

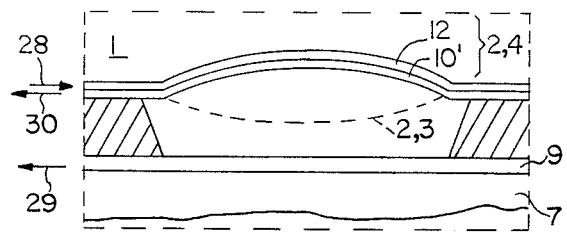
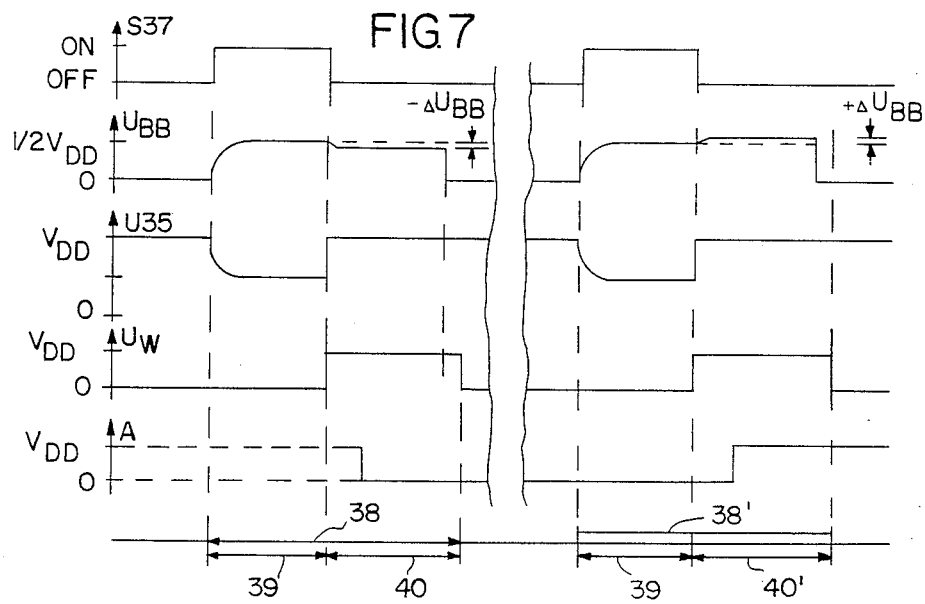
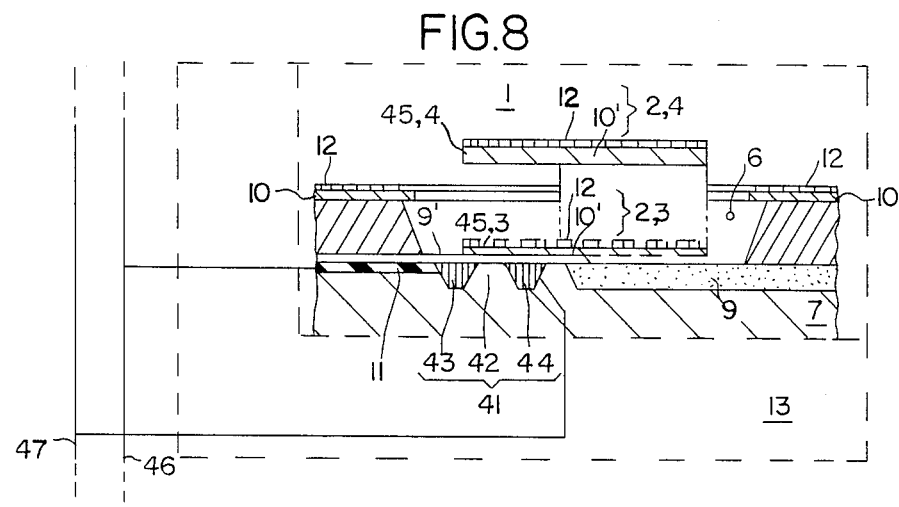

NON-VOLATILE MEMORY DEVICE INCLUDING A MICRO-MECHANICAL STORAGE ELEMENT

This is a continuation of application Ser. No. 095,053 filed Sept. 9, 1987, now abandoned.

FIELD OF THE INVENTION

The invention relates to a memory device for digital electronic signals and particularly, to a memory device including a mechanical component having two stable positions which can be set electrically to store information for a long period of time even after electrical power has been discontinued.

BACKGROUND OF THE INVENTION

Many types of memory elements for digital electronic signals have been commercially available for many years. One type is a ferrite core memory in the form of ferrite rings in single aperture core memories. Another type is in the form of magnetic domains in magnetic bubble memories. Yet another type of memory device is in the form of bi-stable multivibrator in a random access memory (RAM) with a buffer battery to compensate for electrical power failures. Still another type of memory device is in the form of capacitors capable of being charged and discharged within an electrically erasable programmable read only memory (EEPROM).

The EEPROM generally has a slow response and has undergone development as disclosed in an article in "Electronics Week", Mar. 11, 1985 starting at page 69. From this article, it appears that a memory of this type is provided with a few thousand memory elements for most applications. The article also indicates that one can install a power supply producing an operating voltage of about 25 volts for the memory device on the same semiconductor substrate next to the memory elements, the controller and the read-out circuit. The operative voltage of 25 volts is considerably higher than the supply voltage for the semiconductor substrate which is ordinarily about +5 volts.

A description of the elements and the organization of semiconductor memories in general is disclosed in many books such as the book entitled, "MOS Device and Circuit Design", by Oliver J. McCarthy, published by John Wiley & Sons, 1983.

The prior art memory devices have many disadvantages. Ferrite core memories and magnetic bubble memories cannot be manufactured by the same technological methods used for control circuits and are relatively slow and expensive. Semiconductor memories store information only for a limited time such as until the battery on a RAM is exhausted or until the charge has dissipated out of the capacitor of an EEPROM memory cell. The charge in an EEPROM memory cell can be dissipated under the influence of ionizing radiation. The EEPROM memory cell is also limited in the number of writing cycles, typically from $10^4$ to $10^6$.

A memory device in the form of a micro-mechanical device is an alternative memory element for storing digital electronic signals. Micro-mechanical devices, particularly electrical switches of microscopic dimensions, can be fabricated on a semiconductor substrate such as silicon. The same manufacturing steps used to fabricate electronic elements in an integrated circuit can be used. These include manufacturing steps such as diffusion, oxidation, fabrication of thin layers, masking, etching, and photolithographic techniques. U.S. Pat. No. 4,570,139 and the references cited therein generally show the state of the art for the fabrication of micro-mechanical devices.

SUMMARY OF THE INVENTION

The invention provides a memory device for digital electronic signals in which information is retained for long periods of time without electrical power and despite adverse external influences such as ionizing radiation. In addition, the dimensions and operation of the memory device according to the invention are suitable for being integrated with a semiconductor device on a semiconductor substrate.

The invention relates to a memory device for digital electronic signals including at least one storage or memory element. The memory element includes a support and a curved mechanical component. The mechanical component is attached to the support and bridges an open region of the support.

The mechanical component has two stable states, each of which is maintained mechanically and corresponds to a binary logic state of the memory element. In one stable state, the mechanical component forms a concave curve towards the support while in the other stable state the mechanical component forms a convex curve away from the support.

The state of the mechanical component of the memory element can be changed many ways such as electrostatically or electromagnetically. The status of the mechanical component, that is, its state, can be read many different ways such as electronically, or magnetically, or optically.

BRIEF SUMMARY OF THE DRAWINGS

Examples of embodiments according to the invention are described herein in further detail in connection with the drawings in which:

FIG. 6 is a side elevational view partly in section of another embodiment of a memory device according to the invention;

FIG. 7 shows a group of graphs relating to several reading cycles of a memory device according to the invention; and FIG. 8 shows a side elevational view partly in section of yet another embodiment of a memory cell according to the invention along with another circuit for reading out information.

Identical reference numerals designate similar parts in all figures of the drawings.

DESCRIPTION OF THE INVENTION

It is known in the prior art that micro-mechanical and electronic components can be fabricated on a semiconductor substrate by identical processes or processes of the same type. For example, this has been described in the article entitled, "Silicon As A Mechanical Material" by K. E. Petersen, Proceedings of the IEEE, Vol. 70, No.5, May, 1982, pp. 420–456. The memory device according to the invention is particularly advantageous because of its small size and minimal power consumption along with its suitability for being fabricated on a substrate with other electronic components. Furthermore, the memory device according to the invention is particularly well suited to mass production.

Variations and larger embodiments of the memory device according to the invention can also be produced by conventional methods.

Figure 1:
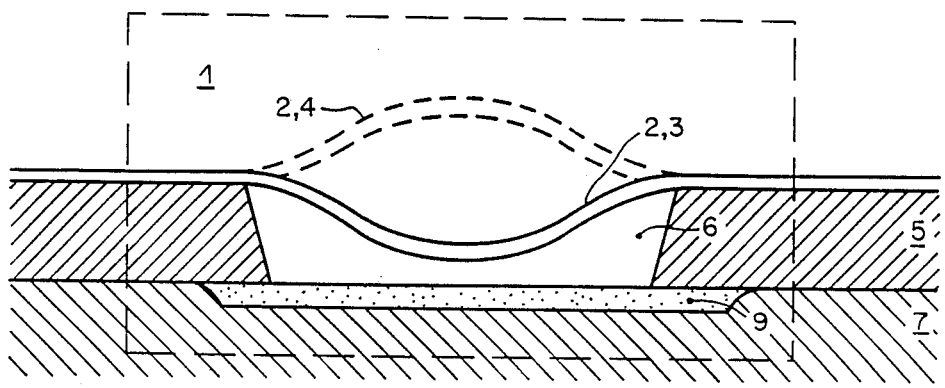
FIG. 1 is a side elevational view partly in section of a memory device according to the invention.

Turning now to the figures, FIG. 1 shows a side elevational view partly in section of one embodiment of a memory element 1 according to the invention. Memory element 1 includes a flexible mechanical component 2 under mechanical stress and connected to a support. The mechanical component 2 has a stable position 3 which is concave and a stable position 4 which is convex. A support layer 5 has a recess 6 under the mechanical component 2 to allow the mechanical component 2 to assume its stable position 3 generally without interference and generally without contacting the support layer 5. Illustratively, the support layer 5 is a single crystal p-type silicon layer grown on the surface of a single crystal wafer of p-type silicon of low conductivity. The wafer is referenced as substrate 7.

Figure 2:
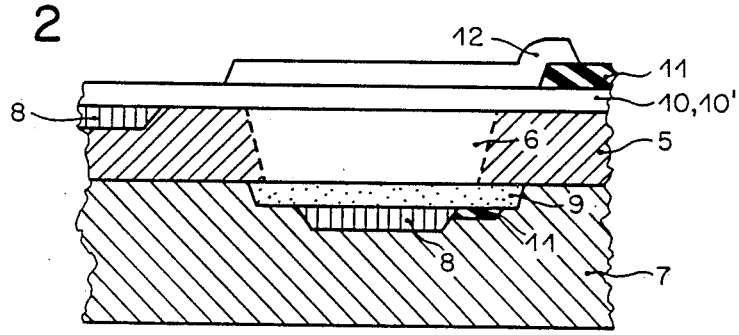
FIG. 2 is a side elevational view partly in section of a structure before etching in order to fabricate a memory device according to the invention.

The fabrication of the memory element 1 can generally follow the state of the art techniques discussed in the aforementioned article by Petersen. The fabrication of the flexible mechanical component 2 is produced from a suitable sequence of layers such as shown in FIG. 2 using photolithographic masks. This fabrication is carried out as the last step by etching the substrate 7 so that the desired arrangement and number of mechanical components 2 are obtained. As shown, the mechanical component 2 has the physical form of a bridge across the recess 6 with both ends of the bridge attached to the remains of the support layer 5.

The fabrication on the substrate 7 can include the production of electronic elements 8 at different locations such as below the mechanical component 2 as shown in FIG. 2. A barrier layer 9 is used to limit the depth to which material is removed during etching of the substrate 7 in order to establish the recess 6. The intended applications of the semiconductor device including the memory element 1 determine which additional components or elements will be fabricated.

Figure 3:
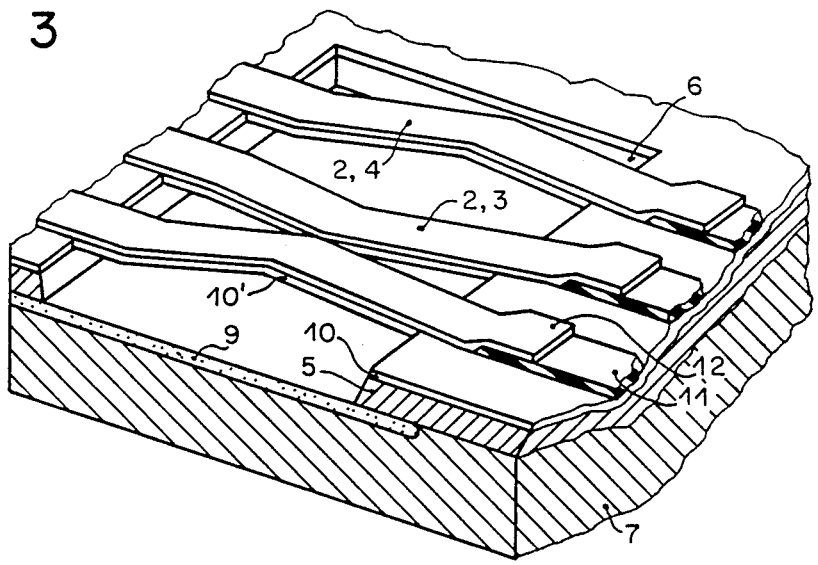
FIG. 3 is a fragmentary perspective view of a memory device according to the invention.

The barrier layer 9 on the substrate 7 can comprise a conducting layer of p+ type silicon of good conductivity produced by diffusing boron into the surface or, a layer of $SiO_2$ can be formed over electronic elements 8 or strip conductors 11 by oxidation of the upper surface of the substrate 7 using conventional techniques During the fabrication of the memory element 1, a layer of p-type silicon of low conductivity can be produced above the barrier layer 9 to a thickness which will determine the height of the support layer 5. Strip conductors 11 and electronic elements 8 can be fabricated in the portions of the substrate 7 outside the region in which the barrier layer 9 is located. Metallic strip conductors 11 as shown in FIGS. 2 and 3 are electrical conductors and can be made of gold, chromium, aluminum, or the like.

An insulating layer 10 of $SiO_2$ is produced by oxidation of the surface of the support layer 5 and provides a base layer 10′ for the mechanical component 2. The base layer 10′ is the portion of the insulating layer 10 extending across the recess 6 as shown in FIG. 3.

In one embodiment, a metallic layer 12, having a thickness of from about 20 to 100 nm is deposited on the base layer 10′ while the substrate 7 is at a temperature in the range of about boiling nitrogen (i.e., approximately 196° C.). The metallic layer 12 can be made from one or more layers of different metals or alloys, such as aluminum, chromium, gold, iron or the like. At operating temperatures of the memory device 1, differences in the amount of thermal expansion between the metallic layer 12 and the base layer 10′ produce a curvature of the mechanical component 2 when the mechanical component 2 has been formed. In subsequent fabricating steps using conventional techniques, the mechanical component 2 is defined and formed by etching.

The final manufactured memory device which is in the form of an electro-micro mechanical unit can be checked as in the case of a conventional integrated circuit (IC) and can be packaged in a conventional IC housing.

The fabricating steps according to a preferred embodiment of the invention result in a large difference in the thermal longitudinal extendability of the metallic layer 12 and the base layer 10′ which is typically made of $SiO_2$. A compression force develops in the base layer 10′ as compared to the metallic layer 12 and this force acts in a generally longitudinal direction of the mechanical component 2 to such extent that the mechanical component 2 becomes curved either upward away from the support layer 5 or downward into the open region 6 after becoming free to move from the etching operation.

FIG. 3 shows an embodiment of the invention including a plurality of mechanical components 2 with identical reference numerals for the similar parts as shown in FIGS. 1 and 2. The transition of the mechanical component 2 from stable position 3 to stable position 4 or the reverse is obtained by overcoming the mechanical spring force in the mechanical component 2. This mechanical spring force is overcome so that the mechanical component 2 passes the transition point between the two stable positions and thereby changes its stable position.

This mechanical bi-stable operation of the mechanical component 2 can be utilized for storing digital electronic signals and information in general. The logic states "0" and "1" can be assigned to the only two stable positions of the mechanical component 2. Using appropriate circuitry, digital data can be written into and read out of a memory device including a plurality of memory elements 1.

The dimensions of the mechanical component 2 can vary and depend, in part, on the IC technology. Using conventional technology, the mechanical component 2 can be fabricated to have a width of about 2 micrometers, a length of about 10 micrometers, and a thickness of about 0.1 micrometer. The deviation of the curve of the mechanical component 2 is approximately 0.1 micrometer for both stable positions 3,4 relative to the transition point between the two stable positions 3,4. The height of the support 5 is about 0.2 micrometer.

The time it takes the mechanical component 2 to move from one stable position to another stable position depends, in part, on the dimensions of the mechanical component 2. The switch-over time between the two stable positions is typically several microseconds. The mechanical component 2 has a very small mass, in the order of a few nanograms. This low mass inhibits the undesirable mechanical change of the stable position of the mechanical component 2 in response to forces arising from acceleration of the mechanical component 2 such as during sudden movements.

Many embodiments of the memory element 1 can be made and some of these embodiments include the following. The mechanical component 2 can be the metallic layer 12 alone without the base layer 10' in which the metallic layer 12 includes at least one metal and/or at least one metal alloy. A plurality of mechanical components 2 independent of each other can be fabricated on the same substrate 7 to enable the storage of correspondingly more information. In addition, a plurality of mechanical components 2 can be arranged parallel to each other bridging the same recess 6 as shown in FIG. 3.

Figure 4:
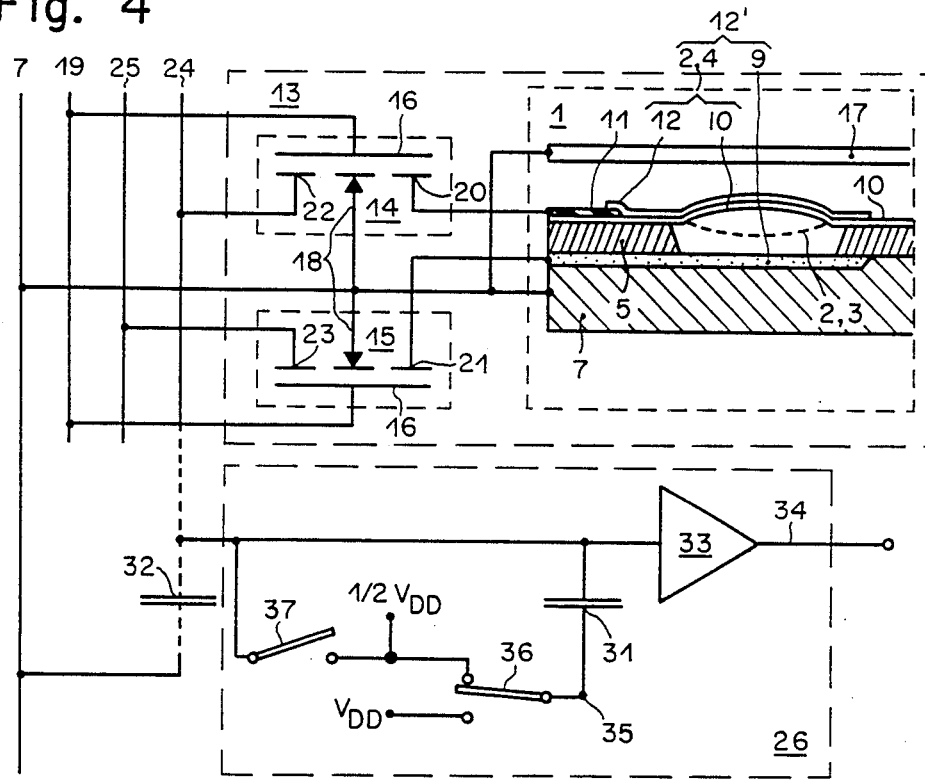
FIG. 4 is a side elevational view partly in section of a memory device according to the invention along with a circuit for reading out information.

Electrostatic or electromagnetic fields can be used to change the stable position of the mechanical component 2. FIG. 4 shows an embodiment of the invention in which there is a very low energy consumption. The barrier layer 9 in FIG. 4 is made of a highly conductive material such as p+ type silicon. The mechanical component 2 including the metallic layer 12 constitutes one plate of an equivalent capacitor 12' while the barrier layer 9 forms the other plate. The capacitance value of the capacitor 12' is determined, in part, by the dimensions of the mechanical component 2, the height of the support layer 5 above the barrier layer 9 and the stable positions 3,4 of the mechanical component 2.

Energizing the capacitor plates of the capacitor 12' can be accomplished in many ways, one of which is shown in FIG. 4. A memory cell 13 includes a substrate 18 having two field effect transistors (MOSFETs) 14,15 each with an insulated gate 16. The memory cell 13 also includes the memory element 1 shown partly in section. The memory cell 13 can also include a shield 17 to shield the operating mechanical portion of the memory element 1. The shield 17 generally has a distance of from 0.1 to 1 micrometer from the memory cells 13 and can shield all of the memory elements 1 located on the same substrate 7. The shield 17 is electrically connected to a reference voltage (not shown) for all the electrically relevant voltage sources formed on the substrate 7 and each of the substrates 18 having the MOSFETs 14,15 for each of the memory cells 13.

Line 19 in FIG. 4 interconnects both of the gates 16 of the MOSFETs 14,15 in the memory cell 13. In addition, the line 19 also connects all the additional gates 16 in additional MOSFET's 14,15 in all of the additional memory cells 13. As used herein, the line 19 will be referred to as a "WORD" (W) line 19. The electrical current through the MOSFETs 14,15 is controlled by the electrical potential on the gates 16. That is, the electrical current between contacts 20 and 22 and between 21 and 23 are controlled by the voltage on respective gates 16.

The contact 20 of the MOSFET 14 is electrically connected to the mechanical component 2 at the metallic layer 12. The contact 22 of the MOSFET 14 is electrically connected to line 24 which is electrically connected to additional contacts 22 of additional MOSFETs 14 in additional memory cells 13. The line 24 will be referred to herein as a "BIT BRIDGE" (BB) line 24.

The contact 21 of the MOSFET 15 is electrically connected to the barrier layer 9 of the memory element 1. Line 25 interconnects the contacts 23 of all of the MOSFETs 15 of all of the memory cells 13 to each other. As used herein, the line 25 will be referred to as a "BIT FORCE" (BF) line 25.

The W line 19, the BB line 24 and the BF line 25 are electrically connected to an electronic means (not shown) preferably located on the same substrate 7. Such electronic means enables the mechanical component 2 in each memory cell 13 to be selectively brought into one of the two stable positions 3,4 and to ascertain or "read" the position status of each mechanical component 2 in each memory cell 13. Generally, the surface requirement of the memory cell 13 is approximately 10 times the surface area of a comparable storage unit of a modern dynamic random access memory (DRAM) building block.

FIG. 4 shows an example of a read-out device 26 suitable to determine the stable position 3,4 of the mechanical component 2 by measuring the capacitance value of the capacitor 12' in the memory cell 13. Information is written into the memory cell 13 by applying a voltage $V_{DD}$ to the W line 19. Typically, $V_{DD}$ is about +5 volts.

When the mechanical component 2 is to be changed into the stable position 4, the BB line 24 and the BF line 25 receive a voltage $V_{SP}$ during a period $\delta$. Typically, VSP is in a range from +10 to +20 volts and the period $\delta$ is about 10 self-oscillations of the mechanical component 2. For reaching the stable position 4, both MOSFETs 14,15 are electrically conductive. As a result, a difference in potential appears in the capacitor defined by the metallic layer 12 relative to the environment such as shield 17 and also in the capacitor defined by the barrier layer 9 and the substrate 7. The barrier layer 9 and the metallic layer 12 have potentials with the same polarity and an electrostatic repulsion force develops between these layers.

If the mechanical component 2 is in stable position 3, the repulsion force between the barrier layer 9 and the metallic layer 12 is sufficient to overcome the mechanical forces maintaining the stable position 3 of the mechanical component 2 so that the mechanical component 2 snaps into the stable position 4. The voltage $V_{SP}$ is maintained on the BB line 24 and BF line 25 for a period S until the self-oscillations of the mechanical component 2 have substantially ceased. Thereafter, the BB line 24 and BF line 25 are switched to the reference voltage. That is, the MOSFETs 14,15 are made to insulate the memory element 1 from electrical signals which may be on the BB line 24 and BF line 25.

When the mechanical component 2 is to be changed into the stable position 3, a voltage $V_{DD}$ is applied to the W line 19 and the BB line 24 is maintained at the reference voltage. The BF line 25 receives a voltage $V_{SP}$ for a time period $\delta$ and the capacitor 12' becomes charged. The electrostatic forces which develop on the mechanical component 2 overcome the mechanical forces maintaining the mechanical component 2 in the stable position 4 so that the mechanical component 2 snaps into the stable position 3. Thereafter, the barrier layer 9 discharges through the BF line 25 so that the barrier layer 9 is brought down to the reference voltage. The W line 9 is also changed to the reference voltage in order to insulate the memory element 1 electrically.

Figure 5:
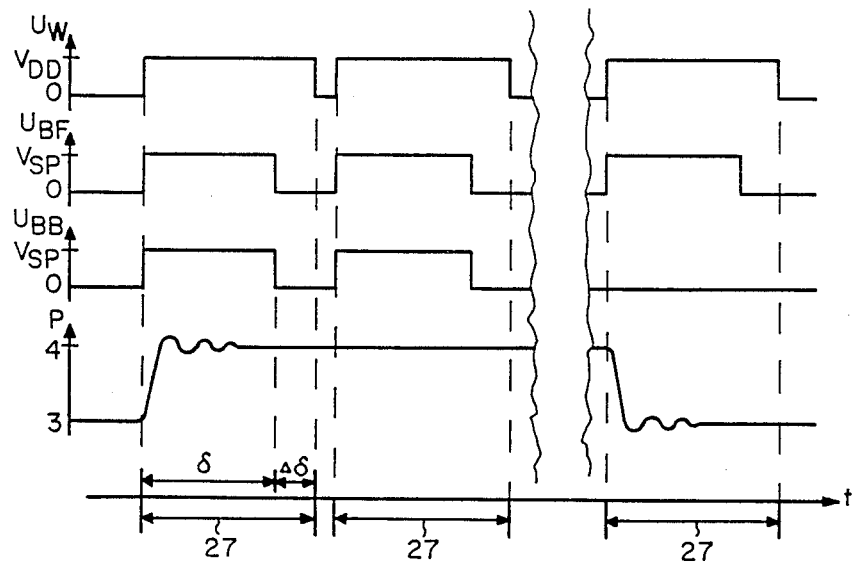
FIG. 5 shows a group of graphs relating to several writing cycles of a memory device according to invention.

FIG. 5 shows several graphs relating to timing sequences for two writing operations. A writing operation establishes a predetermined stable position of the mechanical component 2 to record a logic value. A voltage $U_W$ represents the voltage on the W line 19. A voltage $U_{BF}$ represents the voltage on the BF line 25. A voltage $U_{BB}$ represents the voltage on the BB line 24. All of these voltages are shown relative to time t.

To obtain the stable position 4, $U_{BF}$ and $U_{BB}$ are put under a voltage of $V_{SP}$ for a time period of about $\delta$. To obtain the stable position 3, only $U_{BF}$ is put under a voltage $V_{SP}$ for a time period of $\delta$ while the W line 19 is under a voltage $V_{DD}$ for the additional time period $\Delta\delta$ needed for discharge. Accordingly, a writing cycle 27 includes the sum of the time periods $\delta$ and $\Delta\delta$.

One of the graphs in FIG. 5 shows a function P which is used to indicate the position of the mechanical component 2 as it is switched between the two stable positions 3, 4. FIG. 5 shows two writing cycles 27, one for a stable position 4 and another for a stable position 3.

FIG. 6 shows another embodiment of the memory element 1 in which electromagnetic forces are used to change the position of the mechanical component 2. In FIG. 6, the barrier layer 9 and the metallic layer 12 are fabricated as good electrical conductors. A current source (not shown) preferably integrated into the substrate 7 can supply an electrical current 28 into the metallic layer 12 and an electrical current 29 oppositely directed into the barrier layer 9 for a time period $\delta$ of the writing cycle.

Under these conditions, the magnetic fields around the metallic layer 12 and barrier layer 9 repel each other and the mechanical component 2 is brought to the stable position 3. If, however, an electrical current 30 is flowing in the metallic layer 12 in the same direction as the electrical current 29 in the barrier layer 9, the magnetic fields produced by these electrical currents attract each other so that the mechanical component 2 is brought to the stable position 4.

In a variation of the embodiment shown in FIG. 6, the electrically conductive barrier layer 9 can be replaced by an insulating barrier layer made of $SiO_2$ with a conductive layer fabricated beneath it. Such an arrangement may reduce the number of manufacturing steps to produce the memory device.

Generally, the read-out of information stored in the mechanical component 2 due to its stable position 3,4 can be accomplished using different techniques and systems. Some of these techniques and systems are disclosed herein but others can be synthesized from these examples.

In one embodiment, a read-out device 26 as shown in FIG. 4 can be used to evaluate the apparent capacitance value of the capacitor 12' for the position of the mechanical component 2. As used herein, the apparent capacitance value for the stable position 3 is "C3" and the apparent capacitance value for the stable position 4 is "C4". Typically, the capacitance value of C4 is less than about half the value of the capacitance value C3. Precision capacitor 31 in FIG. 4 is selected to have a capacitance value $$CD = (C3 + C4)/2 \qquad (1)$$

CD = the capacitance of capacitor 31.

The BB line 24 includes leakage capacitance 32 with a value of CS as measured against the reference voltage. The BB line 24 operates as a scanning circuit and is coupled to the input of a SENSE amplifier 33. For the read-out, the information appears at the output 34 of the SENSE amplifier 33 and is suitable for additional processing. The input of the SENSE amplifier 33 is coupled to a terminal of the precision capacitor 31 and the other terminal of the capacitor 31 is coupled to a terminal of a double-throw single-pole switch 36.

As shown in FIG. 4, the voltage on the switch 36 can be either $V_{DD}$ or $\frac{1}{2} V_{DD}$ depending on the position of the switch 36. The BB line 24 is connected to one terminal of a single-pole switch 37 and the other terminal of the switch 37 is connected to a terminal that has a voltage $\frac{1}{2} V_{DD}$. Preferably, the switches 36,37 are integrated into the substrate 7 and can take the form of transistors.

FIG. 7 shows graphs related to the timing sequence for reading cycles 38,38' in connection with the circuitry and memory element 1 shown in FIG. 4. The description of FIG. 7 refers to the components 19,24,25 and 31-37 shown in FIG. 4. The reading cycles 38, 38', respectively, determine the stable positions 3,4, respectively, of the mechanical component 2.

During the entire reading cycle 38, the BF line 25 has an applied reference voltage. The reading cycle 38 at the left includes a PRECHARGE phase 39 and a SENSE phase 40. The coordinate identified by the function "S37" relates to the position of the switch 37 which can be on or off. The coordinate identified by "$U_{BB}$" indicates the voltage on the BB line 24. The coordinate identified as "U35" indicates the voltage at terminal 35. The coordinate identified as "$U_W$" indicates the voltage on the W line 19 and the coordinate identified as "A" indicates the signal at the output 34 of the SENSE amplifier 33.

The initial portion of the reading cycle 38 is the PRECHARGE phase 39. The switch 37 is closed at the beginning of the PRECHARGE phase 39 and the BB line 24 is loaded through the leakage capacitance 32 to a voltage of $U_{BB} = \frac{1}{2} V_{DD}$. During this phase, the capacitor 31 is discharged through the switch 36. The PRECHARGE phase 39 ends with the switch 37 being switched off and switch 36 connected to the voltage $V_{DD}$ so that terminal 35 is at voltage $V_{DD}$.

At the start of the SENSE phase 40, a charge Q31 having a magnitude of about $\frac{1}{2} V_{DD} \times CD$ flows out of the capacitor 31 to the BB line 24. The voltage UW on the W line 19 increases to a voltage of $V_{DD}$ resulting in the MOSFET's 14,15 to couple a charge into capacitor 12' depending on the stable position 3,4 of the mechanical component 2. This charge can be $$Q3 = \frac{1}{2} V_{DD} \times C3 \qquad (2) \text{ or}$$
$$Q4 = \frac{1}{2} V_{DD} \times C4 \qquad (3)$$

The charges as set forth in equations 2 and 3 assume that the capacitance value of CS of the leakage capacitance 32 to be much greater than the sum of the capacitance C3+C4+CD. The change $\Delta U_{BB}$ of the voltage $U_{BB}$ at the input of the SENSE amplifier 33 taking into account the equations 1-3 is as follows:

$$\Delta U_{BB} = -\frac{1}{2} V_{DD}(C3-C4)/CS \qquad (4)$$

for stable position 3 and $$\Delta U_{BB} = \frac{1}{2} V_{DD}(C3-C4)/CS \qquad (5)$$

for stable position 4.

Generally, the ratio (C3−C4)/CS can be about 0.02 and $\Delta U_{BB}$ can be approximately 0.01 $V_{DD}$. According to the aforementioned article by McCarthy, the SENSE amplifiers 33 can be designed using the prior art to ascertain voltage differences reliably and to produce a signal A at the output 34 corresponding to the state of the memory element 1. The SENSE phase 40 terminates when the voltage $U_{BB}$ reduces to the reference voltage and after a waiting period for the discharging of the capacitor 12'. The W line 19 is also brought to the reference voltage so that the barrier layer 9 and the metallic layer 12 are insulated from the circuits 24,25.

FIG. 7 shows graphs relating to a memory element 1 with a mechanical component 2 in stable position 3 being read out in the reading cycle 38 shown at the left. The reading cycle 38' shown at the right refers to the mechanical component 2 in the stable position 4. Each reading cycle 38,38', respectively, has PRECHARGE phase 39 and SENSE phase 40, 40', respectively. For the stable position 3, the capacitance value C3 is greater than the capacitance value CD resulting in the voltage $U_{BB}$ to reduce to less than $\frac{1}{2}$ $V_{DD}$. The SENSE amplifier 33 at output 34 thereafter has an output signal A equal to about 0 volts associated with stable position 3 as soon as the reduction of $U_{BB}$ is detected. Before that point is reached, the output 34 voltage depends upon the preceding reading cycle and the signal A can be $V_{DD}$ or 0 volts.

Generally, the signal A is maintained at about the same value following any reading cycle 38 as long as the supply voltage $V_{DD}$ does not fail. During a reading cycle 38' for the stable position 4, the capacitance value C4 is smaller than CD resulting in the voltage $U_{BB}$ to increase by $\Delta U_{BB}$ to more than $\frac{1}{2}$ $V_{DD}$ in the SENSE phase 40'. The signal A is reduced to less than $V_{DD}$ volts as soon as the SENSE amplifier 33 detects the increase of $U_{BB}$.

The voltage on the BB line 24 is maintained below the triggering threshold for a reversal of the position of the mechanical component 2 to avoid the inadvertent change in the stable position 3,4 of the mechanical component 2. Alternately, the reading cycle 38 is preferably shorter than the duration of a self-oscillation of the mechanical component 2.

FIG. 8 shows a different embodiment of the memory cell 13 which includes an additional MOSFET 41 integrated into the memory element 1. The gate electrode of the MOSFET 41 forms a portion of the mechanical component 2. Only in the stable position 3 in which the mechanical component 2 is directly above conduction channel 42, does a positive voltage on the mechanical component increase the conductivity of the MOSFET 41 between contacts 43,44.

The MOSFET 41 contacts 43,44 are preferably electrically independent from the circuits used in the writing cycle 27 and are fabricated near the barrier layer 9 in the recess 6 beneath an insulating barrier layer 9' on the substrate 7. The laterally projecting portion 45 has about half of its length connected to the mechanical component 2 and acts as a GATE electrode of the MOSFET 41.

The MOSFET's 41 in each of the memory cells 13 are connected through contact 43 to a strip conductor 11 which is connected to a common SENSE circuit 46 and through a contact 44 to a common FEED circuit 47. The SENSE circuit 46 can be read out through a high performance amplifier (not shown) externally located.

The reading cycle 38 can be simplified with the following arrangement. The metallic layer 12 and the FEED circuit 47 can be brought to the same voltage $V_{DD}$. If the GATE electrode (mechanical component 2) is in the stable position 3, the MOSFET 41 conducts electrical current and brings the SENSE circuit 46 to voltage $V_{DD}$. If, however, the GATE electrode (mechanical component 2) is in stable position 4, there is insufficient electric field for the MOSFET 41 to conduct electrical current and the SENSE circuit 46 remains at the reference voltage.

In another embodiment, the metallic layer 12 can be fabricated to be a permanent magnet. Circuitry can be arranged so that the position of the permanent magnet is detected by a conventional magnetic field sensor. In such an arrangement, the magnetic field sensor converts the stable positions 3,4 into an electronic signal during the reading cycle.

In yet another embodiment, the MOSFET 41 as shown in FIG. 8 can be replaced by an optical sensor as is commonly known to one of ordinary skill in the art. In this arrangement, the base layer 10' of the mechanical component 2 contacts the light sensitive point of an optical sensor only in stable position 3 so that light which is projected from a source (not shown) through the base layer 10' onto the substrate 7 enters the optical sensor at the optical contact point between the layer 10' and the optical sensor. Accordingly, the optical sensor produces a logic signal in the form of an electronic signal depending upon the stable position 3,4 of the mechanical component 2.

In a variation of this optical embodiment, the mechanical component 2 can be arranged to cover the light sensor so that in stable position 3 laterally projected light cannot reach the light sensor while in stable position 4 the light sensor is illuminated by the light beam during the reading cycle.

Embodiments using optics can be arranged to trigger optical displays directly according to the techniques disclosed in the aforementioned article by Petersen. Such displays can include a visually readable display of an electronic measuring device.

The memory cells 13 described in the above embodiments can be fabricated alone or in large numbers on a single substrate 7. The memory cells 13 can be organized bit by bit or byte by byte such as in a RAM, EEPROM, etc. and are selected through address circuits. In an embodiment including micro-mechanical displays, the organization of the memory elements 1 can be determined by the display such as a point matrix.

Finally, the above-described embodiments of the invention are intended to be illustrative only. Numerous alternative embodiments may be devised by those skilled in the art without departing from the spirit and scope of the following claims.

We claim:

1. A memory device for storing digital electronic signals comprising
   at least one micromechanical memory element, said memory element comprising a support having a recess defined therein, and a curved mechanical component bridging said recess and having first and second stable positions corresponding to first and second digital logic values, said first stable position being concave down towards said support and said second stable position being convex up away from said support,
   a conductive barrier layer located on a surface of said support under said mechanical component,
   writing means for creating an attractive force between said mechanical component and said barrier layer to cause said mechanical component to occupy said first stable position and for creating a repulsive force between said mechanical component and said barrier layer to cause said mechanical component to occupy said second stable position, and electronic reading circuitry including a field effect transistor coupled to said micromechanical memory element for electronically detecting the one of said first and second stable positions that said mechanical component is in, and for producing an electronic output signal indicative thereof and corresponding to one of said digital logic values.

2. The memory device of claim 1, wherein said mechanical component is made of a metal.

3. The memory device of claim 1, wherein said mechanical component comprises an insulating base layer and at least one metallic layer.

4. A memory device for storing digital electronic signals comprising:
at least one micromechanical memory element, said memory element comprising a support having a recess defined therein, and a curved mechanical component bridging said recess and having first and second stable positions corresponding to first and second digital logic values, said first stable position being concave down towards said support and the said second stable position being convex up away from said support, a conductive barrier layer located on a surface of said support under said mechanical component, writing means for creating an attractive force between said mechanical component and said barrier layer to cause said mechanical component to occupy said first stable position and for creating a repulsive force between said mechanical component and said barrier layer to cause said mechanical component to occupy said second stable position, said writing means comprising a first MOSFET which acts as switch between said mechanical component and a first input line and a second MOSFET which acts as a switch between said barrier layer and a second input line, and electronic reading circuitry coupled to said micromechanical memory element for electronically detecting the one of said first and second stable positions that said mechanical components is in, and for producing an electronic output signal indicative thereof and corresponding to one of said digital logic values.

5. The device of claim 4 wherein said mechanical component is operable for closing an electrical switch comprising part of said electronic reading circuitry in one of said stable positions, whereby the stable position of said mechanical component can be determined.

6. The memory device of claim 25 wherein said electronic reading circuitry for detecting the position of said mechanical component comprises a field effect transistor having source and drain regions formed in said support.

7. The memory device of claim 6 wherein a gate of said field effect transistor forms a portion of said mechanical component, whereby the conductivity of said field effect transistor is determined by whether said mechanical component is in said first stable position or said second stable position.

8. The memory device of claim 1 or claim 4 wherein said attractive and repulsive forces are electrostatic forces created by electrostatic charges on said barrier layer and said mechanical component.

9. The memory device of claim 1 or claim 4 wherein said attractive and repulsive forces are electromagnetic forces created by electric currents flowing in said mechanical component and said barrier layer.

10. The memory device of claim 1, 4, 8 or 9 wherein said barrier layer and said mechanical component form a capacitor whose capacitance value is indicative of whether said mechanical component is in said first or second stable position and wherein said electronic reading circuitry for detecting the position of said mechanical component detects the position of said mechanical component based on said capacitance value of said capacitor.

* * * * *